US 6,667,791 B2
(12) United States Patent
Sanford et al.

(10) Patent No.: US 6,667,791 B2
(45) Date of Patent: Dec. 23, 2003

(54) PASSIVE DRIVE MATRIX DISPLAY

(75) Inventors: James Lawrence Sanford, Hopewell Junction, NY (US); Frank Robert Libsch, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/177,243

(22) Filed: Jun. 21, 2002

(65) Prior Publication Data

US 2002/0196402 A1 Dec. 26, 2002

Related U.S. Application Data

(60) Provisional application No. 60/300,108, filed on Jun. 22, 2001.

(51) Int. Cl.[7] .............................................. H05B 33/32
(52) U.S. Cl. ........................................ 349/139; 349/69
(58) Field of Search .......................... 349/139, 69, 153; 313/169.1, 238, 268, 257, 422, 495, 483, 500; 315/169.1, 169.2, 169.3; 345/50, 55, 59; 361/681, 682

(56) References Cited

U.S. PATENT DOCUMENTS

| | | | |
|---|---|---|---|
| 5,701,055 A | | 12/1997 | Nagayama et al. ......... 313/504 |
| 6,023,073 A | * | 2/2000 | Strite ........................... 257/40 |
| 6,069,443 A | | 5/2000 | Jones et al. ................. 313/504 |
| 6,274,978 B1 | * | 8/2001 | Roach et al. ................ 313/483 |
| 6,370,019 B1 | * | 4/2002 | Matthies et al. ............ 361/681 |
| 6,384,427 B1 | * | 5/2002 | Yamazaki et al. ............ 257/59 |
| 6,420,834 B2 | * | 7/2002 | Yamazaki et al. ....... 315/169.3 |
| 2001/0026125 A1 | * | 10/2001 | Yamazaki et al. .......... 313/505 |
| 2001/0055008 A1 | * | 12/2001 | Young et al. ................ 345/204 |
| 2002/0036725 A1 | * | 3/2002 | Takasugi et al. .............. 349/43 |
| 2002/0110944 A1 | * | 8/2002 | Kian et al. .................... 438/30 |

* cited by examiner

Primary Examiner—Constantine Hannaher
Assistant Examiner—Otilia Gabor
(74) Attorney, Agent, or Firm—Ohlandt, Greeley, Ruggiero & Perle, L.L.P.; Robert M. Trepp

(57) ABSTRACT

There is provided a display apparatus. The apparatus includes (1) a substrate, (2) a display element disposed on the substrate, the display element having (a) a first electrical conductor, (b) a second electrical conductor, and (c) a light switching material disposed between the first electrical conductor and the second electrical conductor, and (3) a via through the substrate for electrically coupling a signal to the first electrical conductor.

27 Claims, 14 Drawing Sheets

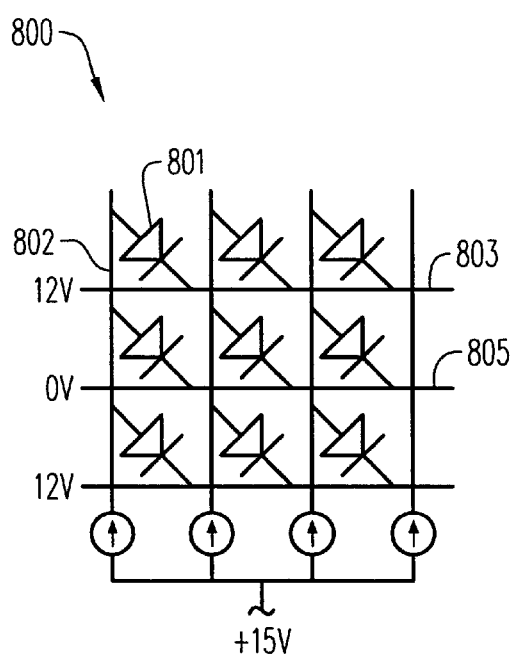
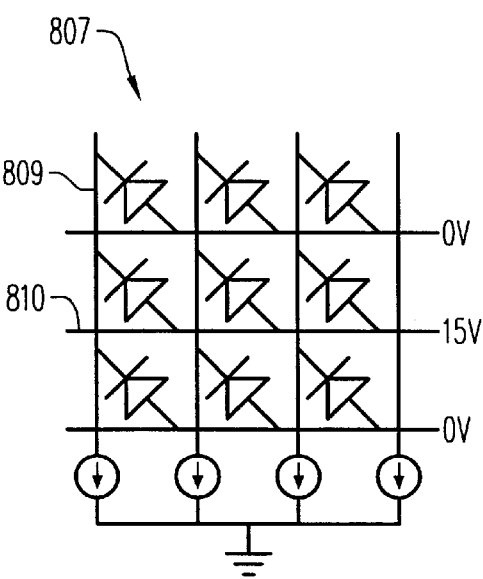
*FIG. 8A*   *FIG. 8B*

PASSIVE DRIVE MATRIX DISPLAY

CROSS-REFERENCE TO RELATED APPLICATIONS

The present application is claiming priority of U.S. Provisional Patent Application Serial No. 60/300,108, which was filed on Jun. 22, 2001.

BACKGROUND OF THE INVENTION

1. Field of the Invention

The present invention relates to displays that utilize light switching elements such as organic light emitting diodes (OLEDs) or liquid crystal (LC), and more particularly, to a display in which such light switching elements are integrated onto a backplane or other substrate.

2. Description of the Prior Art

A display includes a plurality of display elements, or picture elements, i.e., pixels, configured in an array. The display elements include a light switching material, that either generates light (or is emissive), e.g., an OLED, or modulates light, e.g., an LC. An OLED pixel may utilize any of a variety of organic materials that emit light when an electric current is applied thereto. An LC display utilizes an inorganic material to modulate light, that is, alter the phase of the light, as a function of an electric field applied across the material.

The following discussion is primarily directed towards the operation of an OLED display. Nevertheless, the concepts described herein relate to displays that utilize either an organic or an inorganic light switching material.

Illumination of an OLED pixel is controlled by a pixel circuit that may include either a source of current or a source of voltage. It is generally recognized that the constant current source provides a greater uniformity of luminance among the pixels of the array. This is because the dependence of luminance upon current tends to be uniform while luminance at a given voltage the various pixels tends to be less uniform.

Passive or conventional matrix driving is being used for low-resolution OLED displays. However, passive drive resolution is presently limited by the OLED technology to about 100–200 rows for 100 candelas/m$^2$ display brightness levels. Such displays are being developed for applications such as mobile telephones and mobile video equipment. U.S. Pat. No. 6,023,259 to Howard et al. describes a current driver that provides a passive matrix drive current to an OLED.

Control of the luminance of an "on" pixel is commonly achieved by controlling a magnitude of an analog voltage that determines the voltage or current applied to the pixel. A traditional manner of changing a displayed image is for a processor to update a memory for a display controller that periodically and individually addresses each of the pixels of the display, and to turn them "on" (ON) and "off" (OFF) and any luminance level in between as required.

Passive matrix OLED displays are typically small in format, e.g., 100 rows×100 columns. This constraint is due, in part, to the absence of a commercially viable technique for implementing such a display on a backplane or other large substrate material. An active matrix amorphous silicon (a-Si) or a polysilicon (p-Si) backplane typically suffers a thin film transistor (TFT) threshold voltage shift as a function of electrical stress, and it is regarded as suitable only for low current applications as a-Si devices have low mobility, or electron transport, due to drift having units of cm$^2$/V-sec, and are better at applying voltages to a capacitor and operating as a voltage switch; e.g. an active matrix LC. Conventional passive matrix displays on glass are format limited to 320 columns by 240 rows and under, even with split column lines with two drivers for each column with dual row scanning. Also, large size passive drive OLED displays have high row and column voltage drops due to high currents required for passive drive operation. For crystalline silicon (x-Si backplanes), the size is limited to about a 1" diagonal display.

An additional problem when incorporating a plurality of pixel circuits into a display is that of physically distributing the collective elements of the display. That is, the display is a finite area within which the pixels and their accompanying circuitry are confined, yet a constant pitch between pixels must be maintained in order to provide a uniform image.

An OLED display element includes an organic material interposed between a first conductor and a second conductor. A further problem that limits the feasible size of an OLED display relates to the difficulty of providing signal lines, i.e., the first conductor and the second conductor, to form each individual OLED display element. OLED material is damaged by water, and thus it is not suitable for conventional photolithographic patterning with resist techniques that use water.

Prior art large format large size display black plane drive technologies are not suitable for either high resolution or long lifetimes. Crystalline silicon (c-Si) chips that contain suitable drive circuitry are limited in display size to about 0.5 in$^2$. Prior art passive or active matrix displays provide connections to the array from the array edges on a display element side of a backplane substrate.

One prior art approach involves a web-based technology that uses many very small c-Si chips each to drive only a few pixels or alpha numeric display segments that are distributed through out the display. This prior art approach is not suited for large high resolution direct view displays since these c-Si chips would be numerous and visible in the display.

Relatively small (<5.3" diagonal) polysilicon thin film transistors (TFTs) active matrix OLED displays have been recently reported and shown. Several disadvantages exist. First, TFTs have thick gate oxides and relatively low mobility, thus requiring higher gate to source and higher drain to source voltages to be used in order to develop enough current to drive the OLED to desired brightness levels. The higher voltage operation results in higher power consumption. Secondly, TFT threshold and mobility are not stable with usage, and pattern differential aging artifacts will appear. The results of TFT instability stem from the fact that OLED drive current from pixel to pixel will become non-uniform between pixels having different on/off histories. Patterned uniformity differences as low as 1% are troublesome since they can be seen. To date, only video images that tend to somewhat average the usage of each pixel have been publicly shown. Also, TFTs require low duty cycle AC operation to avoid such film degradation mechanisms as charge trapping and bond breaking, which results in threshold voltage shifts and mobility lowering as a function of operating time. AC operation requires additional compensation such as having the TFT gate to source and perhaps even drain to source voltages reversed for an equal amount of time, thus leaving less time for OLED illumination. Since TFT charge trapping time constants are small, charge trapping occurs very quickly and requires voltage reversal at the display's fame rate. The less time allowed for OLED illumination, the higher the driving TFT biases and currents that are needed, and the greater the resulting TFT instabilities. In addition, higher peak currents result in less OLED efficiency, and if high enough, will lead to irreversible OLED film degradation from heating. From a display size and resolution scaling point of view, the higher the pixel content, the smaller the available row scan time, and the worse the rates of degradation. These issues makes TFT backplanes very difficult, if not impossible, for (1) long life, (2) high resolution large displays, and (3) fixed images such as laptop and desk top monitors.

Because of the aforementioned disadvantages, OLED displays have not been as readily commercialized as have many other conventional display technologies.

SUMMARY OF THE INVENTION

The present invention provides for an improved display in which display elements including light switching material are disposed on a backplane or other large substrate. The present invention also provides such a display where the signals are provided to display elements through vias through and on the backplane.

One embodiment of the present invention is a display apparatus. The apparatus includes (1) a substrate, (2) a display element disposed on the substrate, the display element having (a) a first electrical conductor, (b) a second electrical conductor, and (c) a light switching material disposed between the first electrical conductor and the second electrical conductor, and (3) a via through the substrate for electrically coupling a signal to the first electrical conductor.

Another embodiment of the present invention is an apparatus including (1) a substrate, (2) a plurality of display elements disposed on the substrate and configured as (a) a first layer having a plurality of electrical conductors, (b) a second layer having a plurality of electrical conductors, and (c) a light switching material disposed between the first layer and the second layer, and (3) a via through the substrate for electrically coupling a signal to a member of the plurality of electrical conductors in the first layer.

Yet another embodiment of the present invention includes (1) a substrate, (2) a plurality of display elements disposed on the substrate and configured as (a) a first layer having a plurality of electrical conductors, (b) a second layer having a plurality of electrical conductors, and (c) a light switching material disposed between the first layer and the second layer, and (3) a via through the substrate for electrically coupling a signal to a member of the plurality of electrical conductors in the first layer. The plurality of display elements are configured in an array where the array is one of a plurality of arrays configured in a matrix of arrays. The plurality of display elements is configured with a substantially constant pitch between adjacent members of the plurality of display elements, and the matrix of arrays is configured with the substantially constant pitch between adjacent members of the matrix of arrays.

Another display apparatus in accordance with the present invention includes (1) a substrate, (2) a display element disposed on the substrate, the display element having (a) a first electrical conductor, (b) a second electrical conductor, and (c) a light switching material disposed between the first electrical conductor and the second electrical conductor, and (3) a via through the light switching material for electrical coupling a signal to the first electrical conductor.

The present invention also provides for a method for manufacturing a display element on a substrate. The method includes (a) depositing a via having a portion through the substrate and an extension above a surface of the substrate, (b) depositing a first electrical conductor on the substrate, (c) depositing a light switching material over the first electrical conductor, and (d) depositing a second electrical conductor over the light switching material. The via provides a path for a signal through the substrate to one of the first electrical conductor or the second electrical conductor.

BRIEF DESCRIPTION OF THE DRAWINGS

FIGS. 8A and 8B are schematics of two electrical configurations for an array of display elements.

DESCRIPTION OF THE INVENTION

The present invention makes possible low cost, long lived, large size, and high resolution OLED displays that are not presently possible with single chip crystalline silicon or thin film transistor (TFT) back planes. The invention incorporates a matrix of small passively driven arrays. For each passively driven array, a driver is located behind the display. This matrix of small passively driven arrays can be fabricated and synchronously driven such that images displayed appear unbroken and continuous over the display, independent of the number of matrix blocks or arrays. The passively driven arrays are abutted to form a large, higher resolution display, suitable for use, for example, in a laptop computer or a desktop monitor.

The invention incorporates an M by N matrix of passively driven OLED arrays and makes it possible to form a larger higher resolution display. Passive data drivers are located under or behind the display and connections to specially patterned row and column conductors are made by vias on or through a substrate. The invention offers the advantage of using low cost crystalline silicon drivers, which have stable drive characteristics for large high-resolution displays.

Figure 1:
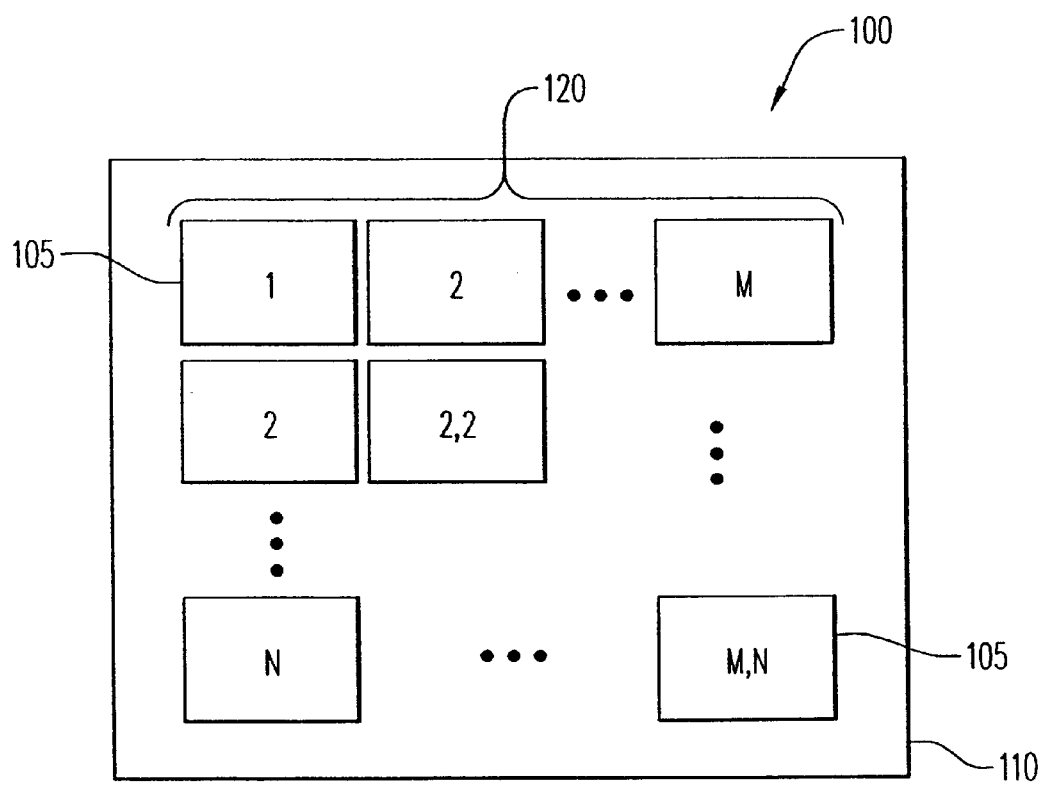
FIG. 1 is a diagram of a display 100, in accordance with the present invention.

FIG. 1 is a diagram of a display 100, in accordance with the present invention. Display 100 includes an M column by N row matrix 120 of passively driven abutted arrays 105 on a substrate 110. Each array 105 includes a plurality of display elements (not shown in FIG. 1), i.e., pixels, organized as, for example, 192 columns and 128 rows. Note that matrix 120 represents the boundaries of the rows and columns and respective driver chip(s) (not shown in FIG. 1), and not necessarily the supporting substrate 110. A driver (not shown in FIG. 1) for each array 105 is located underneath, that is behind, substrate 110 with driver outputs connected to row conductors (not shown in FIG. 1) and column conductors (not shown in FIG. 1) for each respective array 105.

One implementation is for one supporting substrate 110 to contain the M×N arrays 105 so that all resulting fabrication of rows or columns of display 100 is done simultaneously and with identical pitch between adjacent pixels, i.e., no spatial location or area difference would be observed in pixel aperture ratio within or between the M×N arrays 105.

Figure 2A:
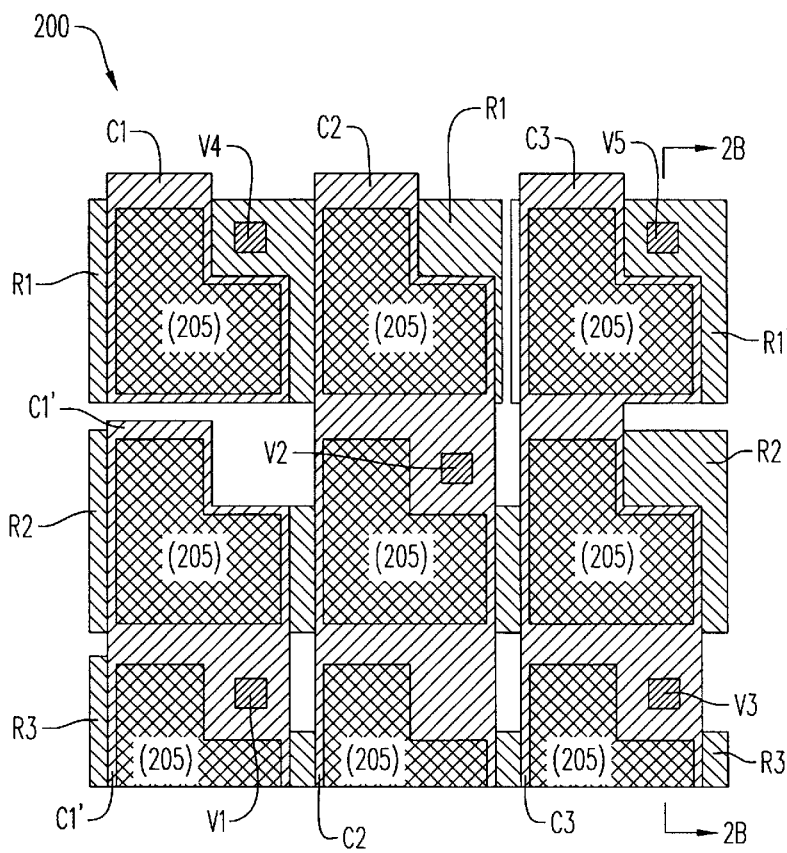
FIG. 2A is a diagram showing an approach to packaging the display elements on the substrate, in accordance with the present invention.
Figure 2B:
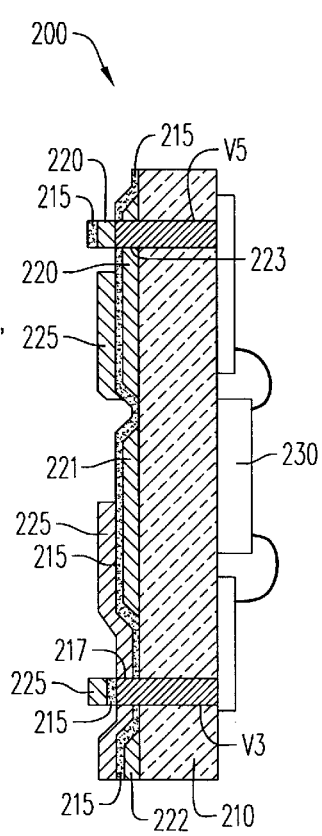
FIG. 2B is a cut-away view of the package of FIG. 2A.

FIGS. 2A and 2B show an approach to packaging display elements 205 on a substrate 210, in accordance with the present invention. A display 200 includes electrical row conductors R1, R1', R2 and R3, and electrical column conductors C1, C1', C2 and C3 patterned orthogonally to row conductors R1, R1', R2 and R3. The row conductors have either a common cathode or common anode connection to all OLEDs in the corresponding row. Similarly, within each column, the column conductors have a common connection to the other OLED electrodes, either anodes or cathodes. Each row or column conductor has an electrical stimulus provided by a row or column driver, respectively.

A passive drive operates by activating one row at a time via electrical stimulus from top to bottom while electrical data is presented on the column lines. For OLEDs, the row current can be m times higher than the current in a single column, where m is the number of columns in the array. As a consequence, the row conductor must have high conductivity to minimize voltage drops along the row conductor. Molybdenum aluminum is a suitable row metal. The column conductor is preferably transparent to allow for the OLED to be viewed without obstruction. Indium tin oxide (ITO) is a suitable column metal. Using an opaque substrate, the row metal would be the first or bottom OLED forming conductor patterned on the substrate. The column conductor would be the last or top OLED forming conductor patterned on the substrate.

Row 1 is split into two segments, and thus is designated as R1 and R1', between columns C2 and C3. This depicts a vertical abutment of two adjacent display arrays (FIG. 1, reference 105). Similarly, there is a break in column 1, and thus a designation of C1 and C1', between rows 1 and 2 for a horizontal abutment of two display arrays (FIG. 1, reference 105). The overlap of a row and a column forms an individual pixel emitting area, e.g. an individual display element 205. All display elements 205 are substantially identical to one another since their edges are restricted by either a row conductor or a column conductor shape or a combination of row and column conductors.

There is a notch in the top right corner of each display element 205. The notch provides room for a substrate via connection to either a row or column conductor. Display 200 includes raised vias V1, V2, V3, V4 and V5. That is these vias protrude through substrate 210 and extend above a surface of substrate 210. Raised vias V1, V2 and V3 provide connections to the column conductors C1' C2 and C3, respectively. Raised vias V4 and V5 depict connections to row conductors R1 and R1', respectively.

FIG. 2B is a cut-away view of the package of FIG. 2A, and shows an OLED vertical structure on a front side of substrate 210. FIG. 2B also shows an example of connections to a driver 230 on a backside of substrate 210. In this cut-away view, it can be seen that the vertical structure has an organic layer 215 over three row conductors 220, 221 and 222, which correspond to R1', R2 and R3, respectively. Column conductor 225, i.e., C3, is disposed over organic layer 215.

Organic layer 215 blankets the entire area of display 200, and thus organic layer 215 covers all raised vias. For example, referring to FIG. 2B, there is shown organic layer 215 on both of raised vias V3 and V5. Raised vias V3 and V5 are shown going through substrate 210 and above its surface. Since organic layer 215 is relatively very thin, i.e., ~0.1 micron, compared to a perturbing via step height i.e., ~1 micron of the raised via V3 and V5, a controlled discontinuous OLED step height coverage can be tailored to provide a connection through organic layer 215. Thus, column conductor 225, i.e., C3, contacts sides of raised via V3 at region 217, and raised via V5 makes connection to row conductor 220, i.e., R1', at region 223.

While it necessary for via V3 to be a raised via, i.e., extending above the top surface of substrate 210, for making the connection to column conductor 225, via V5 can be a regular via in that it need not extend above the top surface of substrate 210 in order to make contact to row conductor 220. A raised via, e.g., V3, may be fabricated by depositing and patterning metal over a regular via to effectively raise, i.e., extend, the regular via above the top surface of substrate 210. Alternatively, organic layer 215 can be heavily doped or removed in an area of a via that does not require a raised via connection.

Driver 230 is a c-Si passive matrix display driver chip, and is shown mounted and wire bond connected on the backside of substrate 210. The backside has at least two levels or layers of connections since input data, control signals and power must be distributed to a matrix of driver 230 chips on a separate level to avoid interference with connections from driver 230 to rows and columns in an array. These wiring layers add to the complexity and cost of substrate 210.

The packaging of row and column drivers can take several forms. An array driver chip has a column driver for each column in an array, and has dimensions smaller than the array. The array driver chip is preferably located behind the array. The row drivers for the array may also be integrated into the same array driver chip or may be integrated into a separate chip that is also located behind the array or maybe located beyond the edges of the display. The array driver chip may also include (a) memory for data storage for all the display elements driven by the array driver chip and (b) data timing control logic to eliminate the need for a display frame buffer.

Thus, to summarize, FIGS. 2A and 2B show substrate 210 and a display element 205 disposed on substrate 210. Display element 205 is configured with first conductor 220, second conductor 225, and a light switching material, i.e., organic layer 215, disposed between first conductor 220 and second conductor 225. Via V5 goes through substrate 210 for electrically coupling a signal to first conductor 220, and via V3 goes through substrate 210 and organic layer 215 for electrically coupling a signal to second conductor 225.

In the embodiment shown in FIGS. 2A and 2B, first conductor 220 is shown as being on a side of a display element 205 proximate to substrate, and second conductor 225 is on a side of display element 205 away from substrate 210. However, the designations of the terms "a first conductor" and "a second conductor" are arbitrary, such that this embodiment could be configured with second conductor 225 on the side of display element 205 proximate to substrate 210, and first conductor 220 on the side of display element 205 away from substrate 210. Furthermore, display 200 can be configured for driver 230 to provide a signal to either of first conductor 220 or second conductor 225.

Display 200 is shown in FIGS. 2A and 2B as having an organic layer 215, i.e., an organic light emitting material, which is a form of a light switching material. However, the present invention also contemplates other types of light switching materials, such as, a light modulating material, a light emitting material, an inorganic light emitting material, a liquid crystal, or a plasma producing material.

In a preferred embodiment, display 200 is part of a larger display laid out such as display 100, shown in FIG. 1. Such a larger display includes (1) substrate 210, (2) a plurality of display elements 205 disposed on substrate 210 and configured as (a) a first layer having a plurality of row conductors R1, R1', R2 and R3, (b) a second layer having a plurality of column conductors C1, C1', C2 and C3, and (c) a light switching material, i.e., organic layer 215, disposed between the first layer and the second layer; and (3) via V5 through substrate 210 for electrically coupling a signal to a member of said plurality of electrical conductors in said first layer, i.e., R1'. Referring collectively to FIGS. 1, 2A and 2B, display elements 205 are configured in array 105, where array 105 is one of a plurality of arrays configured in matrix 120. The plurality of display elements 205 is configured with a substantially constant pitch between adjacent members of the plurality of display elements 205. Matrix 120 is configured with said substantially constant pitch between adjacent members of arrays 105.

Figure 3:
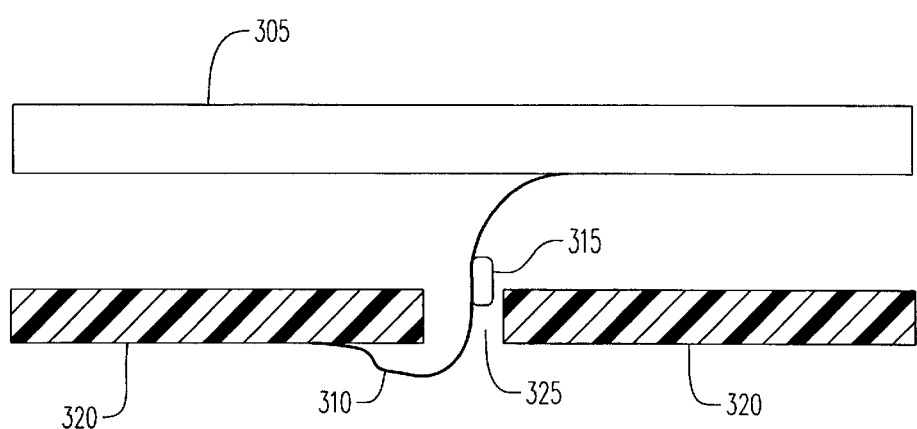
FIG. 3 is a diagram showing another packaging configuration, in accordance with the present invention.

FIG. 3 is a diagram showing another packaging configuration that would be lower in cost and that reduces the number of substrate backside wiring levels as compared to the driver packaging shown in FIGS. 2A and 2B. A passive OLED driver chip 315 on flex circuit 310 is attached to a backside of a display substrate 305. A PC board 320 provides power and signal distribution to driver chip 315 via flex circuit 310. An opening 325 in PC board 320 allows flex circuit 310 to be easily soldered onto a surface of PC board 320 that faces away from substrate 305. Row and column signal outputs of driver chip 315 are connected to substrate 305 by flex circuit 310. PC board 320 is positioned to allow access to driver tab 315. An unconnected end of flex circuit 310 is inserted through opening 325. PC board 320 and flex circuit 310 is aligned for soldering into place.

The substrate material preferably exhibits (1) surfaces that can be made very smooth so as to avoid row to column shorts and (2) an encapsulation barrier to moisture penetration. One suitable choice would be silicon. The via holes can be anisotropically etched through the silicon. Each passive array or group of passive arrays can have its edge defined by backside anisotropic etching. A specially formed carrier can position each array to form a matrix of such arrays to make a display.

Ceramic may be another suitable substrate material. Very thin glass is another possibility, but via sizes are limited to about the thickness of the glass. Flex circuitry is another possibility, however, another process or mechanism would be required to achieve a flat surface.

Another possible substrate uses surface laminar circuit (SLC) printed circuit board technology. There are two advantages of using SLC. One is that SLC has fine line features and reasonably small vias, due to photolithographic patterning and more recently, laser techniques for layout ground rule reduction. Second is that SLC surfaces are made smooth because a chemical-mechanical-polishing (CMP) process is used in combination with such materials as glass filled Teflon™-based dielectrics. Cost can be managed by fabricating the board with one level metal per side with vias through the board.

Figure 4A:
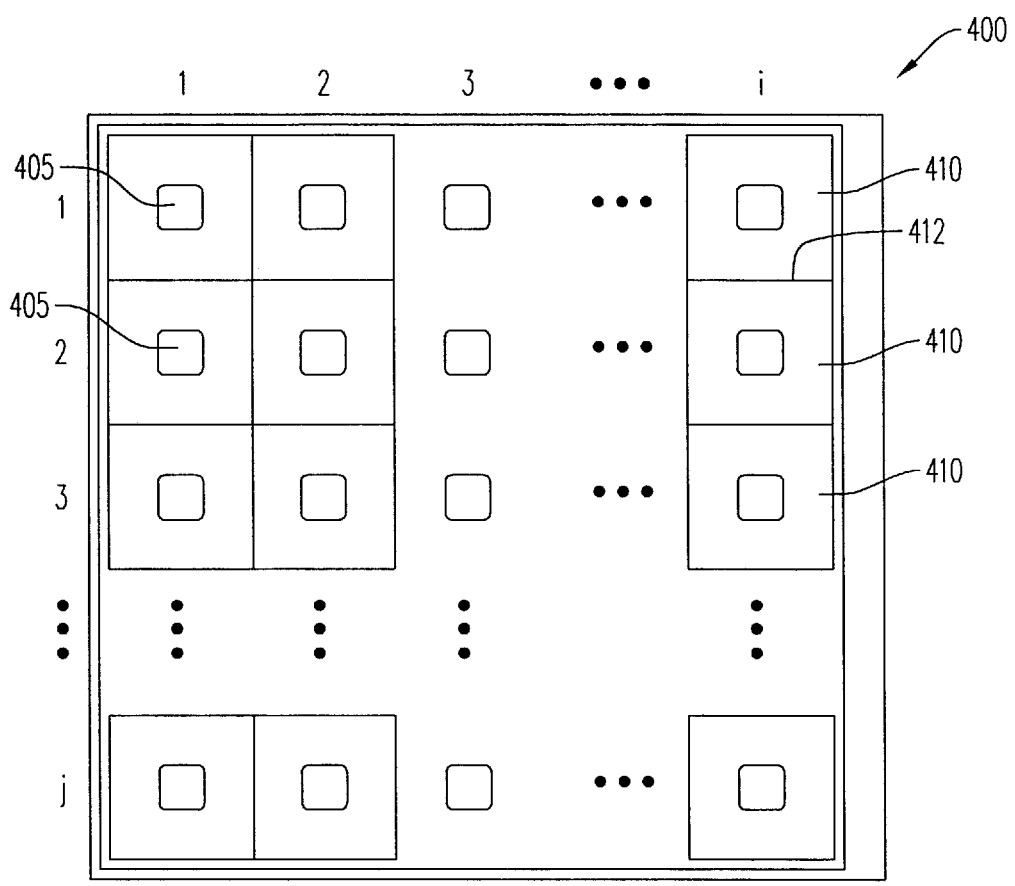
FIG. 4 is a diagram of a concept for a large high-resolution display.
Figure 4B:
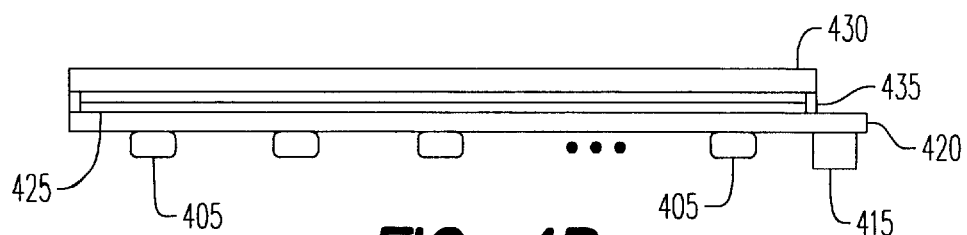

FIG. 4 is a diagram of a concept for a large high-resolution display. A display 400 employs an incremental distribution of c-Si drivers 405 throughout a display viewing area. Display 400 also includes passive matrix displays 410 arranged in an array, a boundary 412 between adjacent passive matrix displays 410 is seamless from the perspective of a viewer. Drivers 405 and other components 415 are arranged on a bottom or backside of a backplane 420. On a top or front side of backplane 420, there is an OLED 425 and a cover glass 430 on OLED 425. An epoxy seal 435 between cover glass 430 and backplane 420 surrounds OLED 425.

Drivers 405 should not be seen when viewing display 400. Column drivers are preferably located behind display 400, and row drivers are preferably located behind display 400 or in front side or backside kerf, to the left, right, top or bottom, or edges of the array of passive matrix displays 410. This is achieved with a back plane that has vias to its backside. The via size and land size can be any suitable or desirable size.

Polysilicon or amorphous silicon can be used for row and column drivers. These can be integrated onto the same glass containing an active matrix array in which there is an active device such a TFT at each pixel. Higher current requirements for passive drive are met by using c-Si. c-Si conductance properties are very stable for long device life, whereas a-Si and p-Si are known to experience problems with stability and life expectancy.

Outputs of silicon drivers are preferably multiplexed to minimize driver and backplane costs, and passive matrix displays 410 have multiplexed driver inputs. An array (i,j) of passive matrix displays 410 can make a larger display 400. Multiplexed row and column voltage drops are reduced by $i*j$ and $j^2$, respectively.

The present invention can be implemented on a PC board backplane. Such an implementation has the advantages of being relatively stiff and easily handled, low cost in high volume, and having low voltage drops. It also lends itself to use of a via moisture barrier.

The present invention can be implemented on an IBM™ SLC surface laminated circuit board. An exemplary embodiment of such a board would provide a board size of 560 mm×450 mm, 50 μm line and space, 100 μm via, 150 μm via land, and 75 μm via land space. A via land is a conductor to which a via makes an electrical connection. The via land may be on the surface, or embedded within, a substrate of circuit board. The via land dimension is typically larger than the via dimension at the interface of the via and the via land.

The present invention could also be implemented on either of a special FR4 board or a standard FR4 board (FR is an acronym for "fire resistant"). An exemplary embodiment special FR4 board would provide a board size of approximately 1100 mm×900 mm, 75 μm line and space, 150 μm via, 500 μm via land, and 75 μm via land space. An alternative embodiment using a standard FR4 board would provide 175 μm line and space, 325 μm via, 1000 μm via land, and 175 μm via land space.

An exemplary embodiment of a display provides for a color 12.1" XGA (1024×768), whose size and format is comparable to that of a standard a-Si LC display. The characteristics of such a system include subpixel size of 80 micron×240 micron, and viewing area of 245.8 mm×184.3 mm. This embodiment employs four to 6 displays per SLC size board.

For an exemplary driver design, assume 128 rows are multiplexed for 100 nit, i.e., candela per meter squared ($cd/m^2$) white luminance. An exemplary column driver is a Clare Micronix MXED101, 6 bit driver with 192 outputs, 0.6 ma maximum per output, which is sufficient for ~200 nits@11 cd/A efficiency, and a die dimension of 18.79 mm by 2.69 mm, which fits inside the passive matrix array. Clare Micronix is a division of Clare, 145 Columbia, Aliso Viejo, Calif. 92656-1490. One 128 output high-current row driver could be used for an entire array.

Rows and columns of driver chips: i=1024*3/192=16, j=768/128=6

Total number of column driver chips: i*j=96

Figure 5:
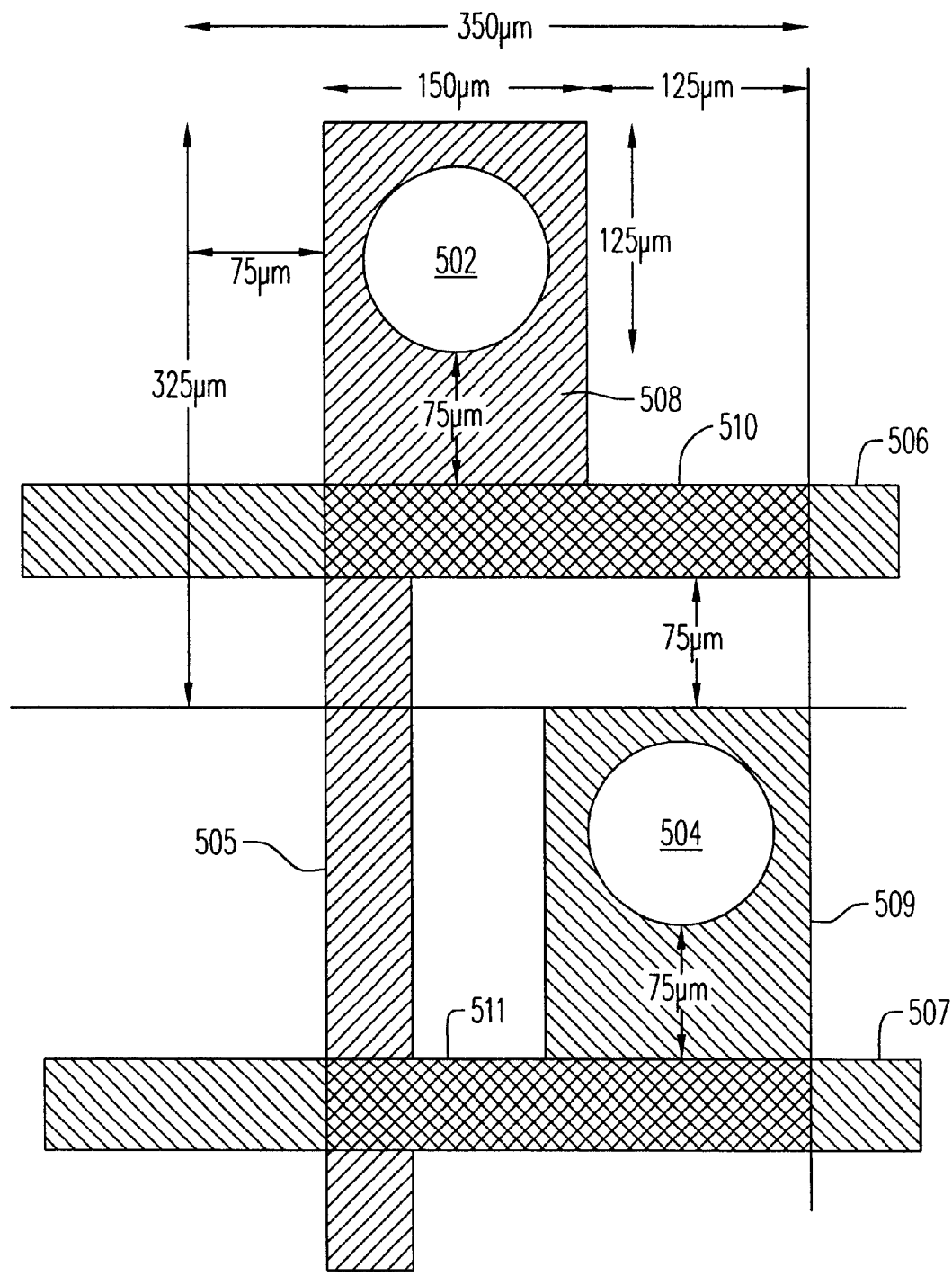
FIG. 5 is a diagram showing row and column display element connections using raised vias.

FIG. 5 is a diagram showing row and column display element connections using raised vias, in accordance with the present invention. The implementation in FIG. 5 uses the IBM™ SLC printed circuit board via dimensions as provided above. A light emitting regions 510 is formed by an overlap of a column conductor 505 and a row conductor 506, and a light emitting region 511 is formed by an overlap of column conductor 505 and a row conductor 507. Two raised vias 502 and 504 and corresponding via lands 508 and 509 provide substrate direct connection to column conductor 505 and row conductor 507, respectively. A minimum pixel area is defined by the 325 micron and 350 micron dimensions in FIG. 5. Emitting area 510 has dimensions of 275 microns by 50 microns and is much smaller than the aforementioned minimum pixel area. The aperture ratio, i.e., emitting area/ pixel area, of the display elements in FIG. 5 is 0.12.

In general, it is desirable to have display elements of small dimensions. However, the smaller the aperture ratio the shorter the life of the light emitting regions due to higher current densities. Small aperture ratios also have undesirable viewing characteristics, for example, a pin cushion effect. Below, there are shown several implementations of displays having display elements with smaller dimensions and higher aperture ratios than that shown in FIG. 5.

Further improvements to the display elements are obtained by adding a third conductor, an insulator with an aperture, and a thin film via, i.e., an improved raised via. As shown below in FIGS. 9–11, the via through the substrate is not a raised via but instead, a regular via; i.e., a via being flush with the substrate surface. A thin film via can be much smaller than the previously described raised via.

Figure 6:
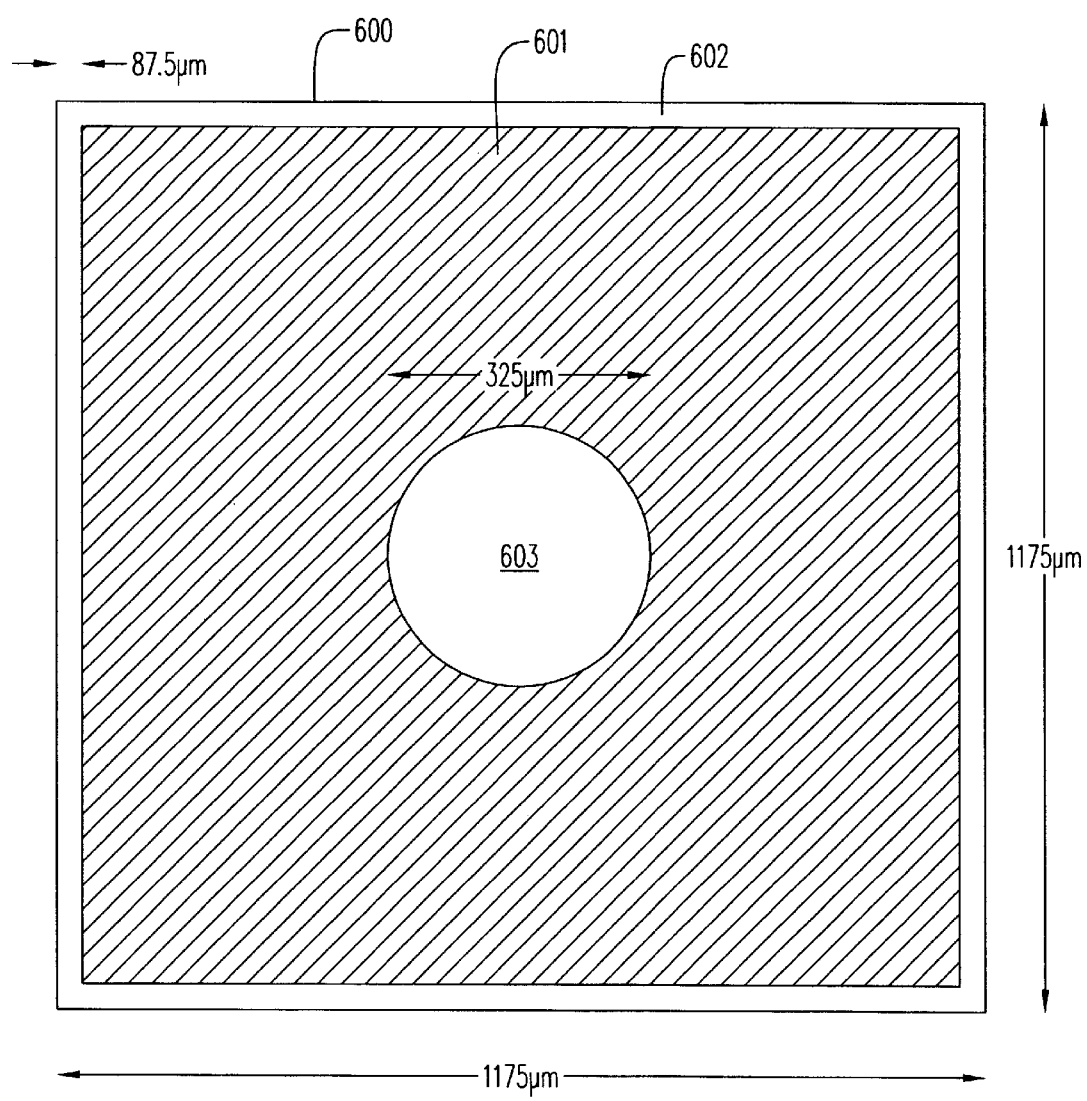
FIG. 6 is an illustration of a printed circuit (PC) board via design example.
Figure 7:
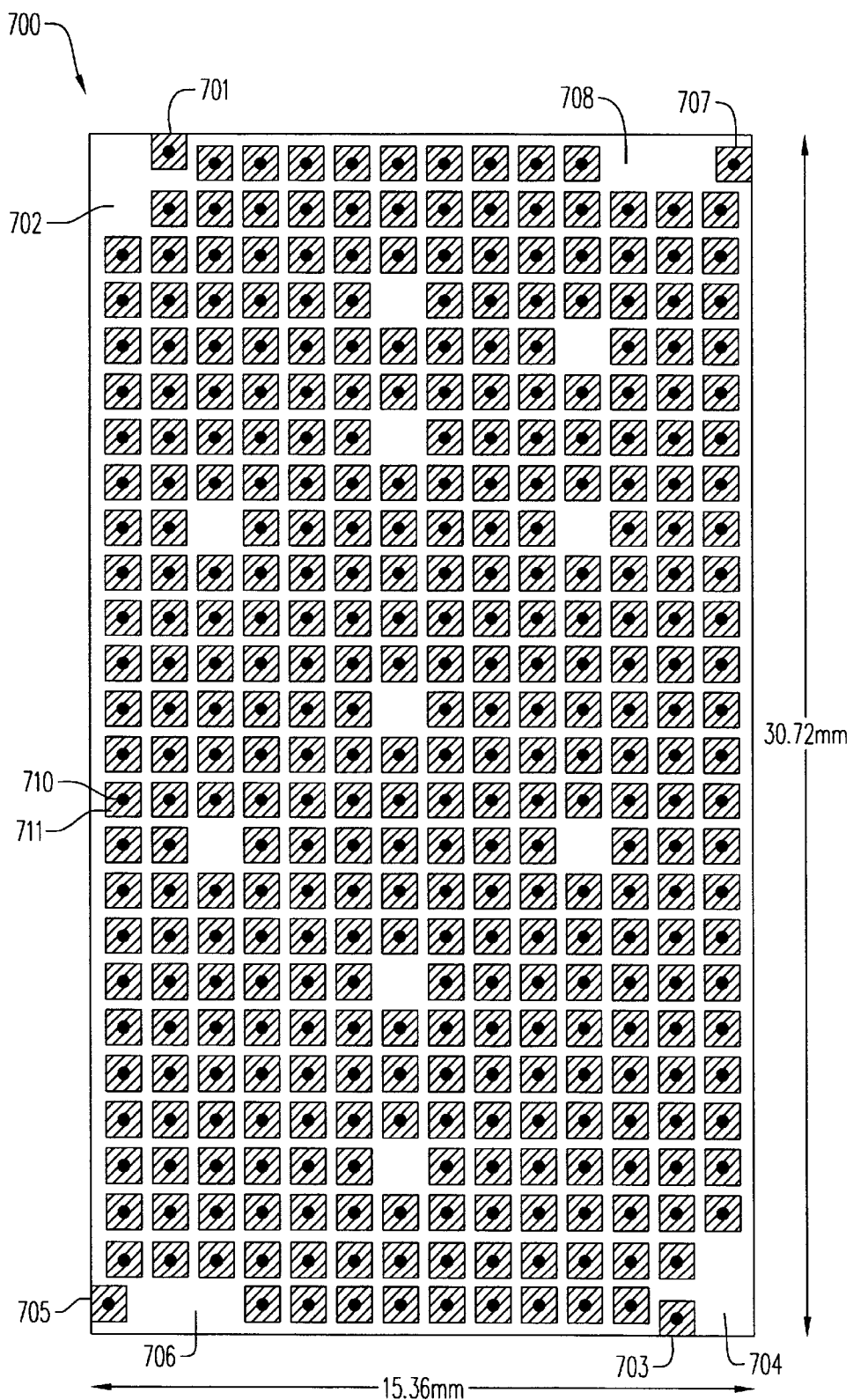
FIG. 7 is an illustration of a PC board topside passive array via land design.

FIG. 6 is an illustration of a standard FR4 PC board via design example using dimensions suitable for employment with the present invention, as shown in FIG. 7. An area 600 includes a space 602 needed to separate a via land 601 from another via land (not shown). A via 603 is centered on via land 601. The standard FR4 board feature dimensions are shown, i.e., 87.5 μm width for space 602, 1175 μm for width of via land width 601 with a border of space 602 on each side, and 325 μm diameter for via 603.

FIG. 7 is an illustration of an exemplary embodiment of an arrangement 700 of vias and via lands. Arrangement 700 includes 320 via lands, where via lands 701, 703, 705, 707 and 711 are designated with reference numerals. The via lands will provide a path for signals to row and column conductors of a passive array of display elements (not shown). Arrangement 700 also includes spaces 702, 704, 706 and 708 where the are no via lands located.

In the example shown in FIG. 7 there are 192 column via connections and 128 row via connections. For an m by n display element array where m=192 and n=128, the number of connections needed to the display is m+n=320. The number of display elements per connection, Nc, is (m×n)/(m+n)=~76.8. Note that a via land, e.g., via land 711, is not required to be smaller than a display element.

One design example of a PC board contact design is an array of ~15x~5 display elements, which allows use of standard FR4 printed circuit board vias and via lands as shown in FIG. 6. As shown in FIG. 7, via lands 701, 707, 703 and 705 are positioned in the proximity of the corners of arrangement 700. Via land 701 connects to the top row of the passive array, via 703 connects to the bottom row of the passive array, via 705 connects to a left-most column of the passive array, and via 707 connects to the right most column of the passive array.

In a full display, a plurality of arrangements similar to arrangement 700, and their corresponding passive arrays, would be situated adjacent to arrangement 700. Spaces 702, 704, 706 and 708 allow for a positioning of via lands from such adjacent arrangements (not shown). That is, for example, via land 707 would be positioned over a space equivalent to space 702, on an adjacent arrangement.

The number of vias, the via size and the via array geometry can be optimized to minimize overall row and column voltage drops. Multiple vias per row or column can be used to further reduce line voltage drops.

The dimensions shown for arrangement 700, i.e., 15.36 mm×30.72 mm, are for 192 columns by 128 rows of display elements. Each display element has dimensions of 80 microns by 320 microns.

FIGS. 8A and 8B are schematics of two electrical configurations for a passive array of OLED display elements. FIG. 8A shows an array 800 having a display element 801 with a common cathode row conductor 803 and a common anode column line conductor 802. An electrical stimulus applied to a row 805 selects row 805 without selecting row 803 and the other rows. FIG. 8B shows an array 807 with a common anode row conductor 810 and a common cathode column conductor 809. An electrical stimulus applied to row 810 selects row 810 without selecting any other row in array 807. FIGS. 8A and 8B illustrate the point the that row conductors can be connected to OLED cathodes or anodes and that the column conductors can be connected to the OLED anodes or cathodes.

Thin film lithography is a well-known technique for manufacturing semiconductor devices. A "thin film via", as used herein, refers to a via formed by a thin film lithography process. A thin film via is used, in accordance with the present invention, to connect a row conductor or a column conductor to a substrate, or a printed circuit board, via land. At least two via connections are necessary, that is, (1) a larger regular (non-thin film) via from a driver side of the substrate to a display side of the substrate, and (2) a smaller thin film via from the substrate via land to an OLED row or column conductor.

Figure 9:
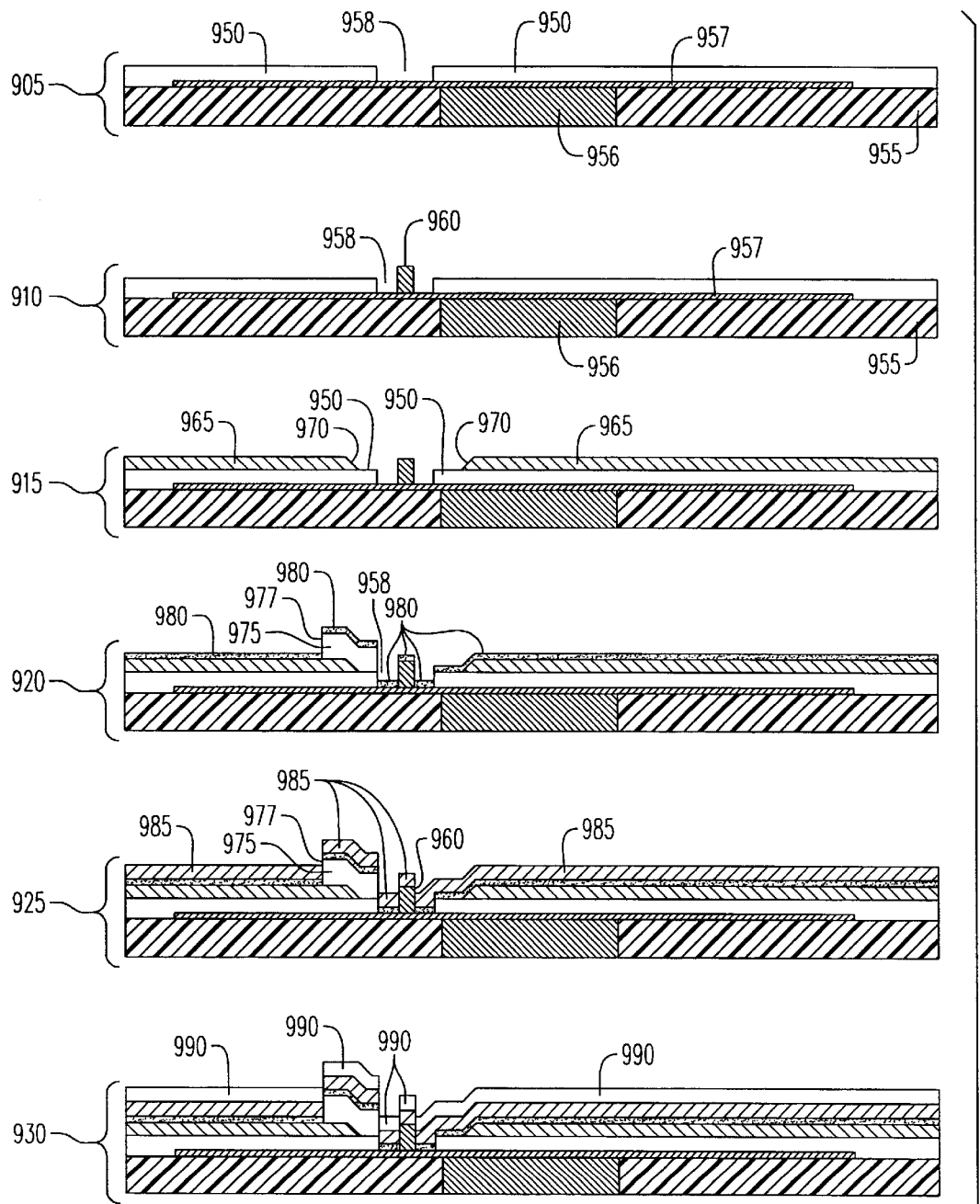
FIG. 9 is a pictorial representation of a method for manufacturing a display element, in accordance with the present invention.

FIG. 9 is a pictorial representation of a method for manufacturing a display element using thin film lithography, in accordance with the present invention. Line and space dimensions of such a display element are much smaller than generally available with printed circuit boards or other substrates. The thin film photolithographic process is used to make rows, columns and vias on a substrate.

In step 905, there is deposited a via 956 having a portion through a substrate, i.e., a PC board 955 and an extension, i.e. a via land 957, above a surface of substrate 955. Via 956 is known as a regular via, and is connected to via land 957. An insulator 950 is deposited over PC board 955 and via land 957. Insulator 950 is treated with a chemical mechanical polish (CMP) and patterned to include an aperture 958 to allow for an electrical contact to via land 957. The CMP planarizes, i.e., makes smooth, the top surface of insulator 950.

In step 910, a metal is deposited over insulator 950 and also into aperture 958 onto an exposed portion of via land 957. The metal is patterned, and excess metal is removed, to form a thin film via 960. Thin film via 960 can be, for example, 10,000 angstroms of tantalum Ta or molybdenum tungsten MoW, with no taper.

Note that regular via 956, via land 957 and thin film via 960 form a continuous electrical path for a signal through substrate 955. Thin film via 960 is an additional portion of the extension described in step 905, and thus, thin film via 960 and via land 957 together form the extension. Note also, with reference to FIGS. 2A and 2B, that via V5 is similar to a combination of via 956, via land 957 and thin film via 960 in that it includes a portion through substrate 210, and a portion in region 223 that extends above the surface of substrate 210.

In step 915, a metal row conductor 965 is deposited and patterned. Note that conductor 965 has a pattern that leaves some of insulator 950 exposed, and that conductor 965 has a tapered edge 970 in the area of the exposed insulator 950. Conductor 965 can be, for example, molybdenum aluminum (Mo/Al) with <30 degree tapered edges and 2,000 angstroms thick.

In step 920, a thick, approximately 1 $\mu$m, insulator, e.g., oxide layer 975, is deposited and thereafter patterned to create a surface discontinuity 977 in a vicinity of aperture 958. Organic layers 980 are deposited over all top surfaces.

In step 925, a column conductor 985 is deposited over all top surfaces. Column conductor 985 also makes contact to the sides of thin film via 960. If column conductor 985 is meant to serve as an anode material, then it comprises a buffer or hole injection layer followed by a layer of indium tin oxide (ITO). On the other hand, if column conductor 985 is meant to serve an a cathode material, then it comprises a very thin, e.g., 100 angstroms, layer of molybdenum aluminum (Mo/Al). Note that oxide layer 975 is thicker than column conductor 985 such that surface discontinuity 977 is also a discontinuity in column conductor 985.

In step 930, a moisture barrier 990 is applied.

Figure 10:
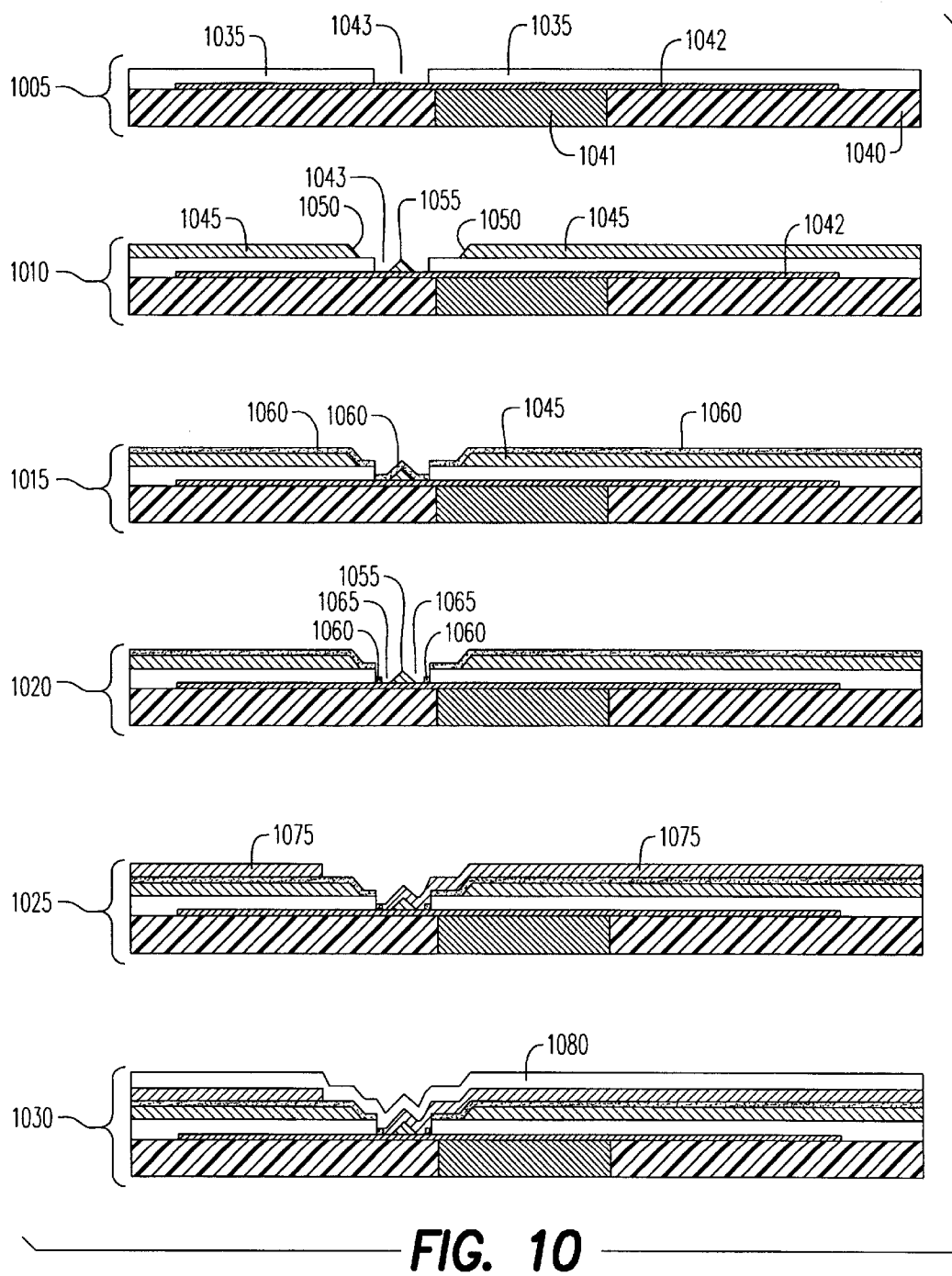
FIG. 10 is a pictorial representation of an alternative method for manufacturing a display element, in accordance with the present invention.

FIG. 10 is a pictorial representation of an alternative method for manufacturing a display element using thin film photolithography, in accordance with the present invention.

In step 1005, an insulator 1035 is deposited over a PC board 1040 having a regular via 1041 connected to a via land 1042. Insulator 1035 is treated with a chemical mechanical polish (CMP) and patterned to include an aperture 1043 to allow for an electrical contact to via land 1042.

In step 1010, a row metal 1045, for example with Al/Mo, is deposited over insulator 1035 and also into aperture 1043 onto an exposed portion of via land 1042. Metal 1045 is patterned to create a thin film via 1055, and in the vicinity of aperture 1043, a tapered edge 1050 of less than 30 degree. Tapered edge 1050 can be accomplished for example, by a dual metal by depositing aluminum (Al), 1000 angstroms to 5000 angstroms, followed by molybdenum Mo, 200 angstroms to 1000 angstroms, and wet etched in a Phosphoric/Acetic/Nitric Acid (PAN) etch or in a dry etch, i.e., reactive ion etch Thin film via 1055 has dimensions of approximately several microns in length and/or in width, and it forms a pyramid shape with a top peak angle less than 70 degrees. The pyramid shape of thin film via 1055 has a high probability of extending through a subsequent OLED layer 1060 (see step 1015) for making contact with, a topside column metal 1075 (see step 1025). The probability of thin film via 1055 making contact with column metal 1075 is increased when the OLED layer 1060 in step 1020 is removed in region of gap 1065. Row metal 1045 can also act as a reflective metal, i.e., mirror, to direct light up through an OLED layer 1060 (see step 1015) and out of a transparent metal (see step 1025).

In step 1015, there are deposited organic layers, such as OLED layer 1060. This deposition can include an anode and a cathode layer of an OLED structure, or the anode and cathode can be combined with step 1010 and step 1025 metalization.

In step 1020, a portion of OLED layer 1060 is removed, for example by using a laser, leaving a gap 1065 between thin film via 1055 and unremoved portions of OLED layer 1060. Note that gap 1065 provides electrical isolation between thin film via 1055 and OLED layer 1060. The removal of the portion of OLED layer 1060 can be accomplished by a technique other than laser removal, such as incomplete step height coverage by having row metal 1045 being substantially thicker, e.g., by a factor of 2 to 10, and/or by having a reverse tapered edged during patterning in step 1010, e.g., angle with the vertical of greater than 90 degrees.

In step 1025, an anode metal composite 1075 is deposited and patterned. The patterning electrically disconnects the left side of anode metal composite 1075 from the right side of anode metal composite 1075. The right side of anode metal composite 1075 fills gap 1065 and overlaps via 1055 for an electrical connection.

In step 1030, a moisture barrier 1080 is deposited.

Figure 11:
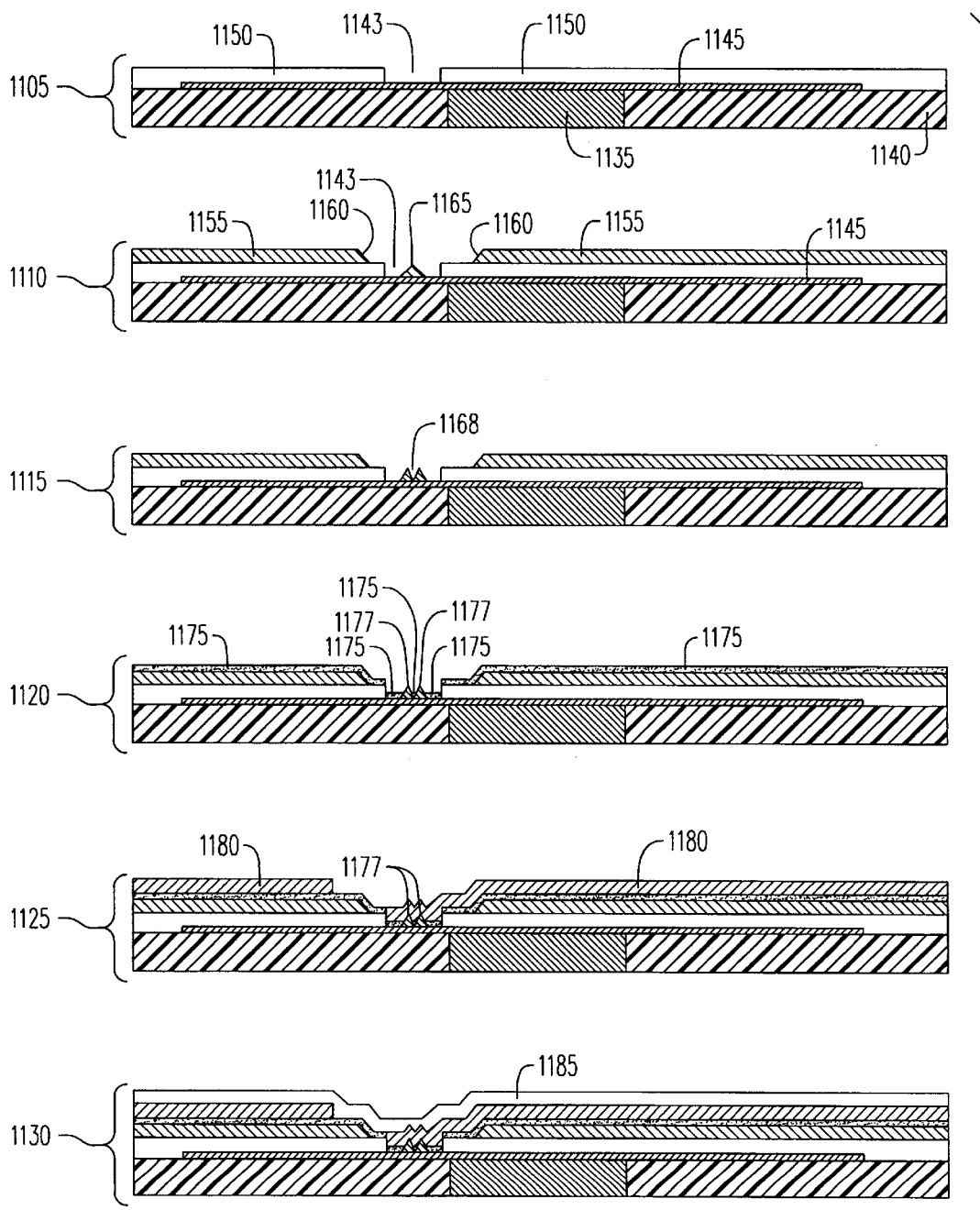
FIG. 11 is a pictorial representation of another alternative method for manufacturing a display element, in accordance with the present invention.

FIG. 11 is a pictorial representation of another alternative method for manufacturing a display element using thin film photolithography, in accordance with the present invention. FIG. 11 shows a cross-section of a conductive metal regular via 1135 from a bottom side of a PC board 1140 (substrate) up to a top of PC board 1140, contacting a metal layer via land 1145 on the top surface of PC board 1140.

In step 1105, an insulator 1150 is deposited over PC board 1140 and via land 1145. Insulator 1150 is treated with a chemical mechanical polish (CMP) and patterned to include an aperture 1143 to allow for an electrical contact to via land 1145.

In step 1110, a row metal 1155 is deposited over insulator 1150 and also into aperture 1143 onto an exposed portion of via land 1145. Row metal 1155 is patterned to create a thin film via 1165, and in the vicinity of aperture 1143, a tapered edge 1160 of less than 30 degrees. Tapered edge 1160 provides for good subsequent deposition step coverage. Thin film via 1165 is formed as a pyramid with a top peak angle less than 70 degrees to provide a high probability of making an electrical contact, through a subsequent OLED layer 1175 (see step 1120), to a column metal 1180 (see step 1125). The probability of thin film via 1165 making electrical contact with column metal 1180 is increased when the surface of thin film via 1165 is roughened (see step 1115).

In step 1115, a laser is used to roughen thin film via 1165, thus yielding a roughened thin film via 1168.

In step 1120, an OLED layer 1175 is deposited. Parts 1177 of roughen via 1168 extend through OLED layer 1175 since the OLED layer 1175 is thin.

In step 1125, an anode metal, i.e., column metal 1180, is deposited and patterned. The left side portion of column metal 1180 is electrical isolated from the right side portion of column metal 1180. The right side portion of column metal 1180 extends over and makes electrical contact with parts 1177 of roughen via 1168.

In step 1130, a moisture barrier 1085 is deposited.

Referring back to step 1115, the roughening of thin film via 1165 to produce roughened thin film via 1168 increases a probability of electrically contacting roughened thin film via 1168 and column metal 1180 through OLED layer 1175. Alternatively, the angle at the peak of roughened via 1168 may be decreased to substantially less than 70 degrees, where a smaller angle provides higher peak electrical fields between roughen via 1168 and column metal 1180, higher probability of field induced breakdown of OLED layer 1175, and higher electrical conductivity between thin film via 1165 to column metal 1180.

It is also possible to swap position of the row metal 1155 and column metal 1180, and to deposit column metal 1180 before OLED layer 1175, followed by row metal 1155. In this scenario, step 1110 provides for the deposition and patterning of column metal 1180, and step 1125 provides for the deposition and patterning of row metal 1155. In this case, row metal 1155 must be thin enough to allow transparency for top light emission.

Cathode metals are metals of low work function energies (such as Ca, LiF, and MgAg) and care in handling and subsequent processing must be taken due to oxygen exposure that will induce corrosion. Anode metals are metals of high work function energies such as ITO, IZO, and Ni.

Conventional OLED devices are fabricated on glass substrates. Other possible substrates for this scheme include, but are not limited to, coated polymer substrates and printed circuit board.

Figure 12:
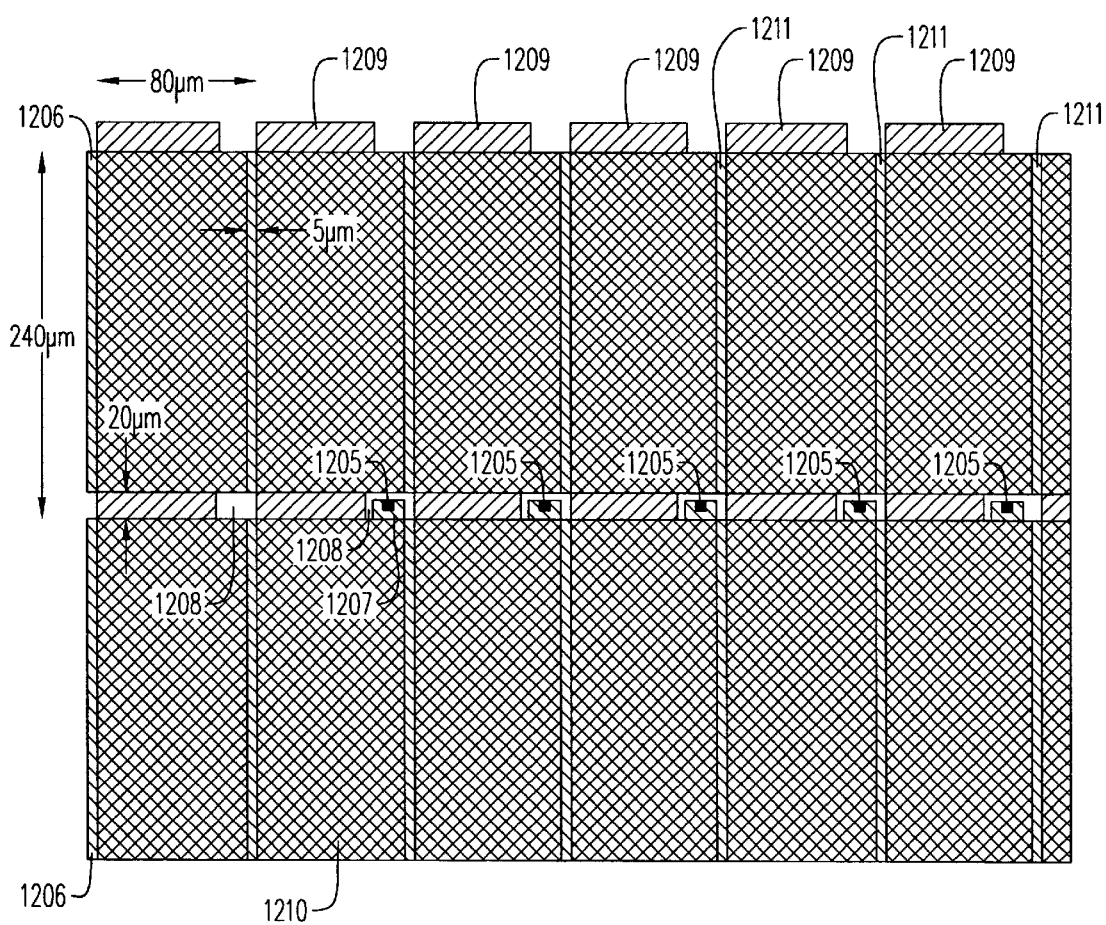
FIG. 12 is an illustration of an OLED pixel layout with row contacts.

FIG. 12 is an illustration of an OLED pixel layout with row via connections using the processing shown in FIG. 9. In FIG. 12, there are shown five contacts or vias 1205, from a row conductor 1206, down to a substrate via land (FIG. 6, reference 601). Vias 1205 are 5 microns wide, whereas substrate via land 601 is 1000 microns wide. Since a via 1205 is much smaller than the smallest size of via land 508 in FIG. 5, the pixel area as shown with dimensions of 80 microns and 240 microns in FIG. 12 is smaller than using only a via land 508 as shown with 350 micron and 325 micron dimensions in FIG. 5. A number of vias 1205 can be used for an improved electrical connection to via land 601. There is an extension 1207 of row conductor 1206 into a notch 1208, or other opening, in a column conductor 1209.

The dimensions of spaces 1211 between adjacent column conductors 1209, and space 1208 between adjacent row conductors 1206, are 5 microns and 20 microns, respectively. A light emitting area 1210 exists at an overlap of row conductor 1206 and column conductor 1209. An aperture ratio is defined as a percentage of emitting area 1210 to pixel area. In this case, the aperture ratio is 86%. Vias 1205 are very small and thus allow for a very high aperture ratio.

Figure 13:
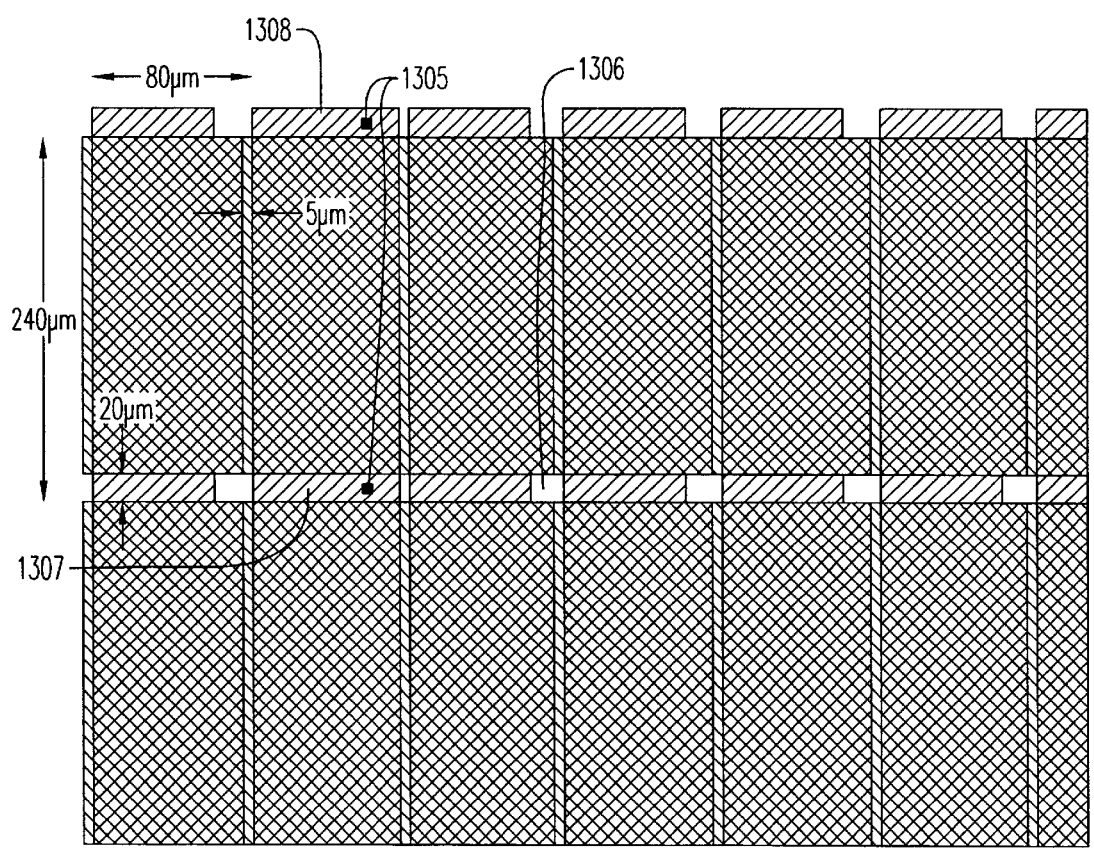
FIG. 13 is an illustration of an OLED pixel layout with column contacts.

FIG. 13 is an illustration of an OLED pixel layout with column via connections. There is shown a column conductor 1308 with two via connections, i.e., column vias 1305, to a substrate via land (FIG. 6, reference 601). Some columns include a notch 1306, but not in column 1308, instead of a notch 1306, there is a column metal 1307. Column metal 1307 is in contact with via 1305 to provide a connection to substrate via land 601.

Figure 14:
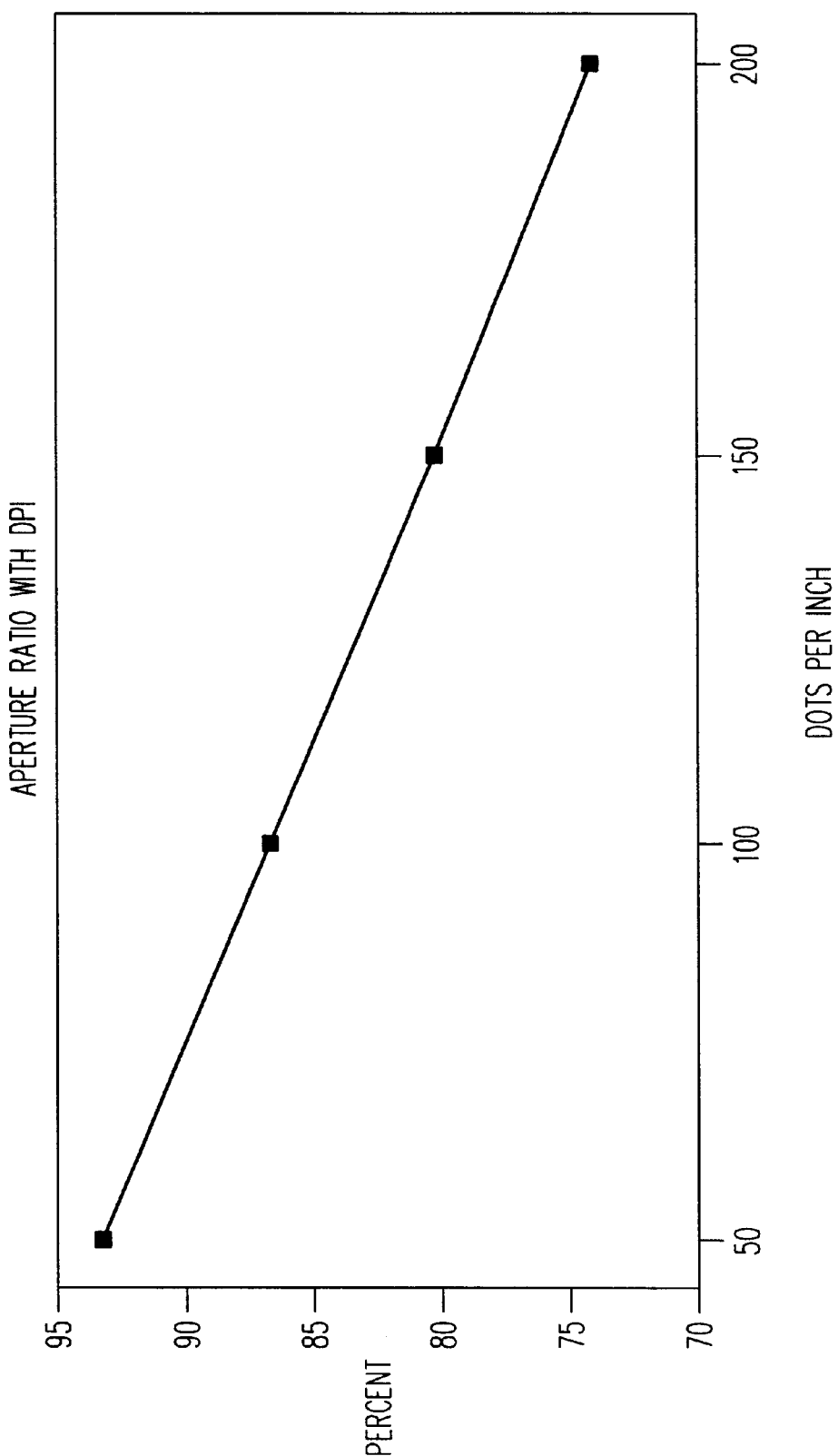
FIG. 14 is a graph of a passive matrix aperture ratio with DPI.

FIG. 14 is a graph of a passive matrix aperture ratio with dots per inch (DPI). Referring back to FIG. 12, FIG. 14 shows aperture ratio relationships using the dimensions of space 1211 between adjacent column conductors and space 1208 between row adjacent conductors, with number of pixels or dots per inch. The aperture ratio for the pixel is very high, over a wide range of resolution. For example, the aperture ratio is ~90% at 72 DPI, which is very high compared to 12% at 72 DPI for the configuration shown in FIG. 5. In FIG. 14, even at 200 dots per inch, the aperture ratio is 74%, which is considered to be very high. This compares quite favorably to the best aperture ratio (~50%) found in conventional commercial 200 DPI TFT LC displays.

A high aperture ratio reduces current density in an OLED for a given luminance level, thus allowing a longer OLED lifetime. In addition, the high aperture makes a display look better to a person viewing it. Display elements having a low aperture ratio appear as points of luminance. This is harder on the eyes or to view than display elements having high aperture ratios. Higher aperture ratio display elements appear to be continuous from a first element to a second element, and thus easier on the eyes to view.

The methods taught herein are also applicable to liquid crystal (LC) displays and any other passive array device that can be driven a row at a time. The method for making larger arrays can also be applied to active matrix arrays. For very large format displays, local drivers for driving display subsections may prove to be useful if the row and column connections are passed through the substrate to an array rather than from the array edges. Long thin row and column lines can have high resistance and capacitance, and thus very long time constants that may not allow for proper refresh rates. Local drivers allow the row and column lines to be shorter for substantially lower line resistance and capacitance, thus allowing faster display refreshing rates. In other words, a matrix of arrays achieves the performance of a display the size of an array at a display size of the matrix.

With an active matrix OLED display, it may be most useful to provide power and its return through a substrate to avoid high voltage drops that would occur with a long thin, and not very thick, metal line. Thicker and wider metal, even planes, on the substrate backside can be used to minimize the voltage drops that occur with high currents. Numerous local connections through the substrate to the active matrix array can be made allowing the current to go through the substrate rather than out the edges of the array. Localized power supply decoupling is also possible to minimize transient effects from switching.

Figure 15:
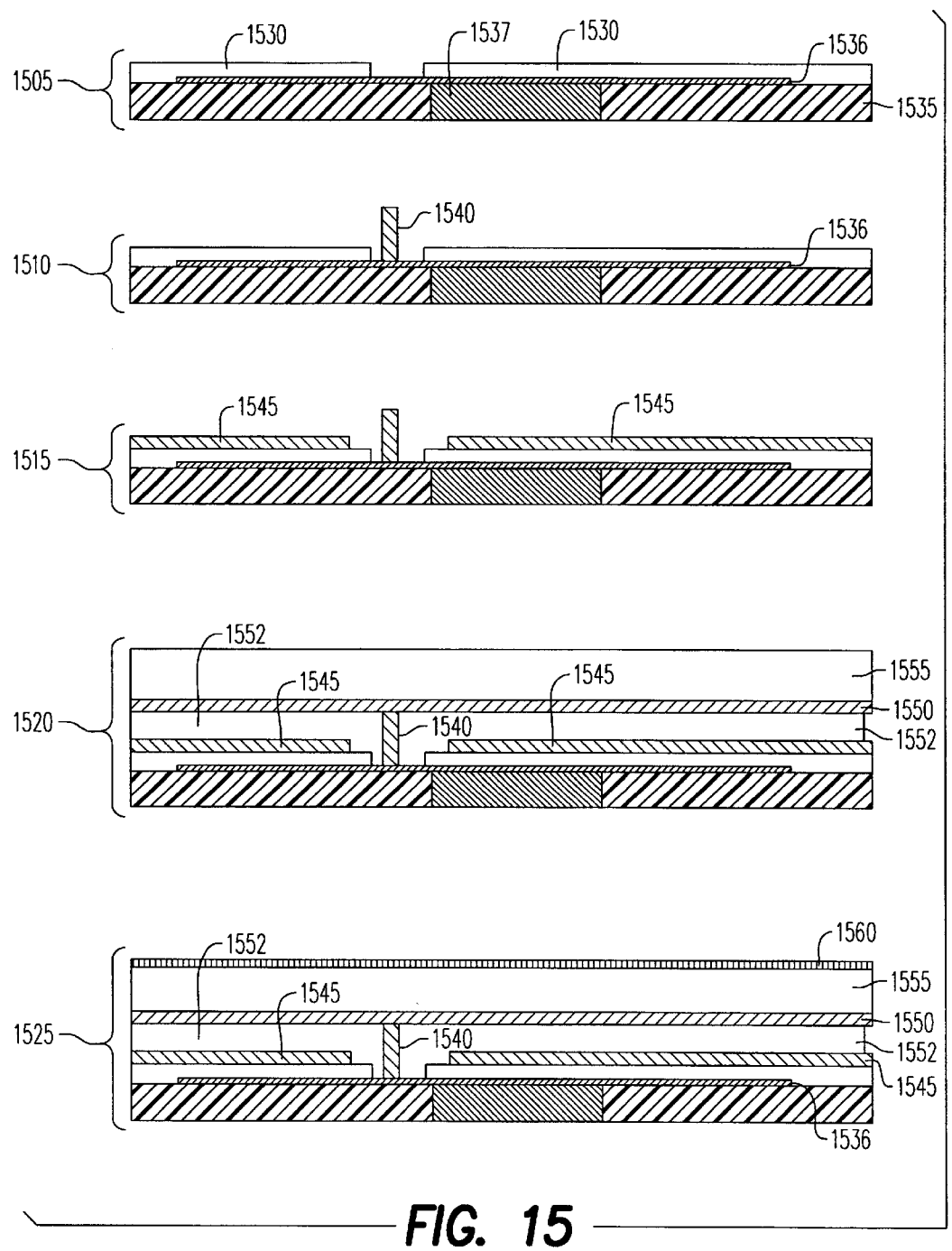
FIG. 15 is a pictorial representation of a method for manufacturing a liquid crystal display element, in accordance with the present invention.

FIG. 15 is a pictorial representation of a method for manufacturing a reflective liquid crystal display element, in accordance with the present invention. Advantages that relate to manufacturing large size and large format OLED displays, e.g., a matrix of arrays, which allow the performance of a small array while achieving the display size of the matrix, also apply to LC displays. FIG. 15 shows one possible fabrication sequence in which row and column drivers are behind a display.

In step 1505, an insulator 1530 is deposited over a PC board 1535 having a via land 1536 and a via 1537. Insulator 1530 is treated with a chemical mechanical polish (CMP), and pattered for contact openings.

In step 1510, a via 1540 is deposited and patterned on via land 1536. Note that via 1540 is not tapered. A suitable configuration of via 1540 is about 10,000 angstroms high with 50,000 angstroms width and length, and being made of tantalum Ta or molybdenum tungsten MoW.

In step 1515, a row metal 1545 is deposited over insulator 1530. A suitable material for row metal 1545 is aluminum Al with a depth of about 2000 angstroms.

In step 1520, a patterned column metal 1550 and a cover glass 1555 are placed on via 1540, leaving a space that is filled with an LC 1552. A column metal 1550 is patterned and made to contact a top of via 1540. An electrical connection is thus provided between column metal 1550 and via land 1536.

In step 1525, a polarizer 1560 is placed over cover glass 1555. Polarizer 1560 polarizes incident illumination into the display element. The polarized illumination passes through column metal 1550 and is reflected by row metal 1545. LC 1552 changes the illumination polarization. The amount of polarization change depends upon characteristics of LC 1552 and an electric field between row metal 1545 and column metal 1550. If the polarization change is $n*90$ degrees, where n is an odd integer, then none of the reflected light passes out through polarizer 1560. If the polarization change is $m*180$ degrees, where m is any integer, then the reflected illumination passes out through polarizer 1560.

FIG. 15 shows via 1540 having a thickness for connecting column metal 1550 to via land 1536. Note that if via 1540 was omitted and row metal 1545 overlapped the area otherwise occupied by via 1540, then a connection of via land 1536 to row metal 1545, which is deposited in step 1515, can also be made. In a similar manner, row conductor to via land connections can be made for the methods of fabrication shown in FIGS. 9, 10 and 11.

There is an advantage or a degree of freedom that is possible with using an LC as compared to an OLED. The LC does not require a high steady state current to sustain its state as does the OLED. Thus, high current and high voltage drop are not issues with the LC.

Within a display, rows from a single passive matrix array can be connected to rows of a left and a right adjacent passive matrix arrays. Furthermore, it is possible to put row lines on a cover glass. The cover glass can extend over a bottom substrate left and right edges with the rows line also extending beyond the substrate left and right edges. It is possible for a single passive matrix array row driver to drive the entire array. This allows the row lines to be connected without having to form the vias to make connections through the LC. The driver, behind each passive matrix array, needs only to have data or column drivers. It is possible to use a commercially available data driver.

Referring again to FIG. 15, a thin LC alignment layers (not shown) of rubbed polyimide or diamond-like carbon may be deposited (a) on the top surfaces of via 1540 and row metal 1545 surfaces on substrate 1535 and (b) on the bottom surfaces of column metal 1550 on cover glass 1555. The alignment layers provide surface alignment of LC molecules in order to get a correct polarization or phase of illumination with and without an electric field applied to the electrodes, i.e., row metal 1545 and column metal 1550.

Some of the electrical design characteristics of an exemplary display in accordance with the present invention are summarized below:

(I) Display brightness: 100 nits of white (R=30 nits, G=50 nits, B=20 nits)
(II) Small molecule OLEDs
   (A) Kodak Red and green 11/99 cd/A goals with voltage and current density scaled from a research blue OLED data.
   (B) Color pixel luminance needed=R, G or B*128*3/0.86; multiplex ratio, area and aperture adjustments
   (C) Red: 6 cd/A@11.5 V, 1.8 A/cm*cm at 13400 nits
   (D) Green: 15 cd/A@11 V, 1.2 A/cm*cm at 22300 nits
   (E) Blue: 12 cd/A@10.5 V, 0.6 A/cm*cm at 9000 nits
(III) Passive matrix current: Column (Row=64*Column)
   (A) Red: 346 ua (22.12 ma)
   (B) Green: 230 ua (14.75 ma)
   (C) Blue: 115 ua (7.37 ma)
   (D) Total passive matrix row current: 44.24 ma
(IV) Total array row current: 16*44.24 ma=0.708 A
(V) Total current for every 128th row: 6*0.708=4.25A
   (A) If 128 row drivers are used then every row driver must sink 4.25A
   (B) If 768 row drivers are use then every row driver must sink 0.705A.
(VI) Column conductor
   (A) Assume: 5 ohms/square
   (B) R=5 ohms*240*128/75=2.048 kohm
   (C) Maximum Vcol=2.048 kohm*346 ua=0.71 V
   (D) Vcol reduction: multiple PC board contacts/column
(VII) Passive array row conductor
   (A) Assume: $3 \times 10^{-6}$ ohm*cm and 0.2 um thick metal
   (B) R=3E-6*0.008*192/(0.022*2E-5)=10.47 ohm
   (C) Maximum Vrow=10.5 ohm*44.24 ma 0.463 V
   (D) Vrow reduction: multiple PC board contacts; increase row metal thickness
(VIII) Board row voltage drop
   (A) Assume: 2 oz copper@$2 \times 10^{-6}$ ohm*cm
   (B) R=$2 \times 10^{-6}$*0.024*1024/(0.0046*0.022)=0.49 ohm;
   (C) V=0.708*0.49=0.35 V
   (D) Assume: row driver voltage drop when selecting a row <0.4V
(IX) Power supply voltage: 1.5+2.5(output compliance)+0.71+0.46+0.35+0.4=16 V
   (A) Compliance voltage extrapolated for the MXED101 at 0.34 ma.
(X) Maximum power dissipation all pixels on: 4.25A*16V=68 W
(XI) Voltage and power reduction possibilities:
   (A) In x-si, min. compliance voltage can be <1V for 10% lower voltage & power.
   (B) 1 V reduction possible by cutting non-OLED voltage drops in half.
   (C) Switch to Polymer OLEDs (Uniax web site)
      (1) 7V forward voltages at 10,000 nits
      (2) Similar or better cd/A and comparable lifetimes
      (3) Power supply voltage can be reduce by 4 V
      (4) Integrate row driver with column driver reduces power by 0.75V
(XII) Off row driver voltage
   (A) >16−2.4−2(onset)=11.6 V to assure off OLEDs don't turn on.
   (B) ~14 V should be sufficient for OLED reverse biasing; Vf<−0.4V.
(XIII) Possible row driver implementations
   (A) 768 row drivers that sink 0.71 A each.
   (B) 128 row drivers that sink 4.25 A each.
   (C) Integrate passive matrix row drivers; each row driver sinks 45 ma.
      (1) PC board row and high current row driver voltage drops eliminated by low current drivers that pass current directly to the PC boards ground plane.

Some of the characteristics of the backside electronics for an exemplary PC board are summarized below.

(I) Extra backside wiring levels power planes.
   (A) Two power planes (B) 3 signal layers (4 total with front side via landing pads)

(C) 41,0000 vias (II) Display connector (III) Display frame buffer (A) Video in (B) Six 18 bit RGB and column driver control signals (IV) 96 OLED column driver chips (V) One voltage reference and 120 precision resistors.

(VI) 128 (4A) or 768 (0.7A)~14V row drivers (VII) 14V series regulator (VIII) Power distribution and decoupling (A) 16 V power (B) 3 V to 5 V logic power Some of the advantages of the present invention over prior art techniques are indicated below.

(I) Stable OLED driving method by using x-si drivers.

(II) Reasonable driver costs with possible reduction.

(III) PC board keeps passive matrix voltage drops low.

(IV) PC board cost is low.

(V) Performance (A) Very high aperture ratios.

(B) Net power dissipation is better than a-si backplanes.
  (1) Better voltage drop management with tiling and PC board Cu.
  (2) Voltage for current source is lower due to x-si drivers than for a-si.
  (3) Power can be reduced with PLEDs and design improvements (C) Display uniformity and lifetime only limited by the OLED technology.

(D) Compact: thin ~3 mm; bezel width on 3 edges ~2 mm.

(VI) Passive matrix tiling is scaleable in resolution and size.

The present invention employs three types of vias, (1) a regular via through a substrate, flush with a surface of the substrate, (2) a raised via, which is an extension of the standard via through the substrate, and (3) a thin film via. The first two via types, as taught, are relatively large (>100 microns) and fabricated during a substrate fabrication process. The thin film via is relatively small (~5 microns) and made during an OLED device fabrication process. Both the raised via and the thin film via make connection to a first conductor by protruding through an OLED layer and sometimes protruding through a second conductor. A combination of the regular via with a via land and the thin film via provides a spatial connection transform to allow large size displays having high DPI or high resolution.

It should be understood that various alternatives and modifications could be devised by those skilled in the art, and the present invention can be applied to displays other than those using OLEDs or LCs. The present invention is intended to embrace all such alternatives, modifications and variances that fall within the scope of the appended claims.

What is claimed is:

1. An apparatus comprising:
   a substrate;
   a plurality of display elements disposed on said substrate and configured as
     (a) a first layer having a plurality of electrical conductors,
     (b) a second layer having a plurality of electrical conductors, and
     (c) a light switching material disposed as a substantially continuous layer between said first layer and said second layer; and
   a via through said substrate for electrically coupling a signal to a member of said plurality of electrical conductors in said first layer.

2. The apparatus of claim 1, wherein said first layer is on a side of said plurality of display elements proximate to said substrate.

3. The apparatus of claim 1, wherein said first layer is on a side of said plurality of display elements away from said substrate.

4. The apparatus of claim 1, further comprising a circuit disposed on said substrate and electrically coupled to said via, for providing said signal to said member of said plurality of electrical conductors in said first layer.

5. The apparatus of claim 4,
   wherein said plurality of display elements are disposed on a first side of said substrate, and
   wherein said circuit is disposed on a second side of said substrate.

6. The apparatus of claim 1, wherein said light switching material comprises a material selected from the group consisting of a light modulating material, a light emitting material, an organic light emitting material, an inorganic light emitting material, a liquid crystal, and a plasma producing material.

7. The apparatus of claim 1, wherein said display element comprises a component selected from the group consisting of an organic light emitting diode (OLED) and a liquid crystal (LC).

8. The apparatus of claim 1,
   wherein said plurality of display elements are configured in an array,
   wherein said plurality of electrical conductors in said first layer comprises a plurality of row conductors, and
   wherein plurality of electrical conductors in said second layer comprises a plurality of column conductors patterned orthogonally to said plurality of row conductors.

9. The apparatus of claim 1, wherein said plurality of display elements is configured with a substantially constant pitch between adjacent members of said plurality of display elements.

10. An apparatus comprising:
    a single substrate;
    a plurality of display elements disposed on said substrate and configured as
      (a) a first layer having a plurality of electrical conductors,
      (b) a second layer having a plurality of electrical conductors, and
      (c) a light switching material disposed as a substantially continuous layer between said first layer and said second layer; and
    a via through said substrate for electrically coupling a signal to a member of said plurality of electrical conductors in said first layer,
    wherein said plurality of display elements is configured in an array, and
    wherein said array is one of a plurality of arrays configured in a matrix of arrays.

11. The apparatus of claim 10,
    wherein said plurality of display elements is configured with a substantially constant pitch between adjacent members of said plurality of display elements, and
    wherein said matrix of arrays is configured with said substantially constant pitch between adjacent members of said matrix of arrays.

12. An apparatus comprising:

a single substrate;

a plurality of display elements disposed on said substrate and configured as
   (a) a first layer having a plurality of electrical conductors,
   (b) a second layer having a plurality of electrical conductors, and
   (c) a light switching material disposed as a substantially continuous layer between said first layer and said second layer; and a via through said substrate for electrically coupling a signal to a member of said plurality of electrical conductors in said first layer, wherein said plurality of display elements are configured in an array, wherein said array is one of a plurality of arrays configured in a matrix of arrays, wherein said plurality of display elements is configured with a substantially constant pitch between adjacent members of said plurality of display elements, and wherein said matrix of arrays is configured with said substantially constant pitch between adjacent members of said matrix of arrays.

13. An apparatus comprising:

a substrate;

a display element disposed on said substrate, said display element having
   (a) a first electrical conductor,
   (b) a second electrical conductor, and
   (c) a light switching material disposed between said first electrical conductor and said second electrical conductor; and a via through said light switching material for electrically coupling a signal to said first electrical conductor.

14. The apparatus of claim 13, wherein said first electrical conductor is on a side of said display element proximate to said substrate.

15. The apparatus of claim 13, wherein said first electrical conductor is on a side of said display element away from said substrate.

16. The apparatus of claim 13, further comprising a circuit disposed on said substrate and electrically coupled to said via, for providing said signal to said first electrical conductor.

17. The apparatus of claim 16, wherein said display element is disposed on a first side of said substrate, and wherein said circuit is disposed on a second side of said substrate.

18. The apparatus of claim 15, wherein said light switching material comprises a material selected from the group consisting of a light modulating material, a light emitting material, an organic light emitting material, an inorganic light emitting material, a liquid crystal, and a plasma producing material.

19. The apparatus of claim 13, wherein said substrate is a single substrate, and wherein said display element is a member of a plurality of such display elements.

20. The apparatus of claim 19, wherein said first electrical conductor is in a first layer and said second electrical conductor is in a second layer, and wherein said light switching material is disposed as a substantially continuous layer between said first layer and said second layer.

21. The apparatus of claim 19, wherein said plurality of display elements is configured in an array, and wherein said array is one of a plurality of arrays configured in a matrix of arrays.

22. A method for manufacturing a display element on a substrate, comprising:

depositing a via having a portion through said substrate and an extension above a surface of said substrate;

depositing a first electrical conductor on said substrate;

depositing a light switching material over said first electrical conductor; and depositing a second electrical conductor over said light switching material, wherein said via provides a path for a signal through said light switching material to one of said first electrical conductor or said second electrical conductor.

23. The method of claim 22, further comprising before depositing said first electrical conductor, depositing an insulator on said substrate in a pattern that leaves an aperture in said insulator for said extension.

24. The method of claim 23, further comprising after depositing said insulator, treating said insulator with a chemical mechanical polish (CMP) to planarize a top surface of said insulator.

25. The method of claim 22, wherein depositing said first electrical conductor comprises tapering an edge of said first electrical conductor.

26. The method of claim 22, further comprising, prior to said depositing said light switching material over said first electrical conductor, depositing an insulator on a surface in a vicinity of said extension, wherein said insulator has a thickness that is greater than a thickness of said second conductor.

27. An apparatus comprising:

a single substrate;

a plurality of display elements disposed on said substrate, wherein said plurality of display elements is configured in an array and with a light switching material disposed as a substantially continuous layer, and wherein said array is one of a plurality of arrays configured in a matrix of arrays; and a via through said substrate for connection to said plurality of display elements.

* * * * *